United States Patent
Shigenami et al.

(10) Patent No.: US 7,027,347 B2
(45) Date of Patent: Apr. 11, 2006

(54) SEMICONDUCTOR MEMORY DEVICE

(75) Inventors: Kenichi Shigenami, Kanagawa (JP);
Shunichi Sukegawa, Ibaraki (JP)

(73) Assignee: Sony Corporation, (JP)

( * ) Notice: Subject to any disclaimer, the term of this patent is extended or adjusted under 35 U.S.C. 154(b) by 52 days.

(21) Appl. No.: 10/749,510

(22) Filed: Jan. 2, 2004

(65) Prior Publication Data

US 2004/0190363 A1    Sep. 30, 2004

(30) Foreign Application Priority Data

Jan. 14, 2003    (JP)    ............................ P2003-005804

(51) Int. Cl.
  *G11C 8/00*    (2006.01)
(52) U.S. Cl. .............................. 365/230.03; 365/230.01
(58) Field of Classification Search ........... 365/230.03, 365/196, 189.04, 189.01
  See application file for complete search history.

(56) References Cited

U.S. PATENT DOCUMENTS 5,835,963 A * 11/1998 Yoshioka et al. ............. 365/49

FOREIGN PATENT DOCUMENTS

JP    03-273594    12/1991

* cited by examiner

*Primary Examiner*—Thong Q. Le
(74) *Attorney, Agent, or Firm*—Rader, Fishman & Grauer, PLLC; Ronald P. Kananen

(57) ABSTRACT

A semiconductor memory device for improving the utilization of a shared data bus and the data transfer rate in a multi-bank DRAM and realizing high speed data accessing without increasing a scale of a control circuit, wherein the multi-bank DRAM has memory banks provided with an address register for holding a write address, a data register for holding write data, an address matching detection circuit for detecting whether an address held in the address register matches with an address input this time, and when reading is performed continuously from writing on the same address of the same memory bank, reading is not performed on a memory cell specified by a read address and data held in the data register is output as read data, so that memory accessing made continuously to the same address can be performed at a high speed.

15 Claims, 8 Drawing Sheets

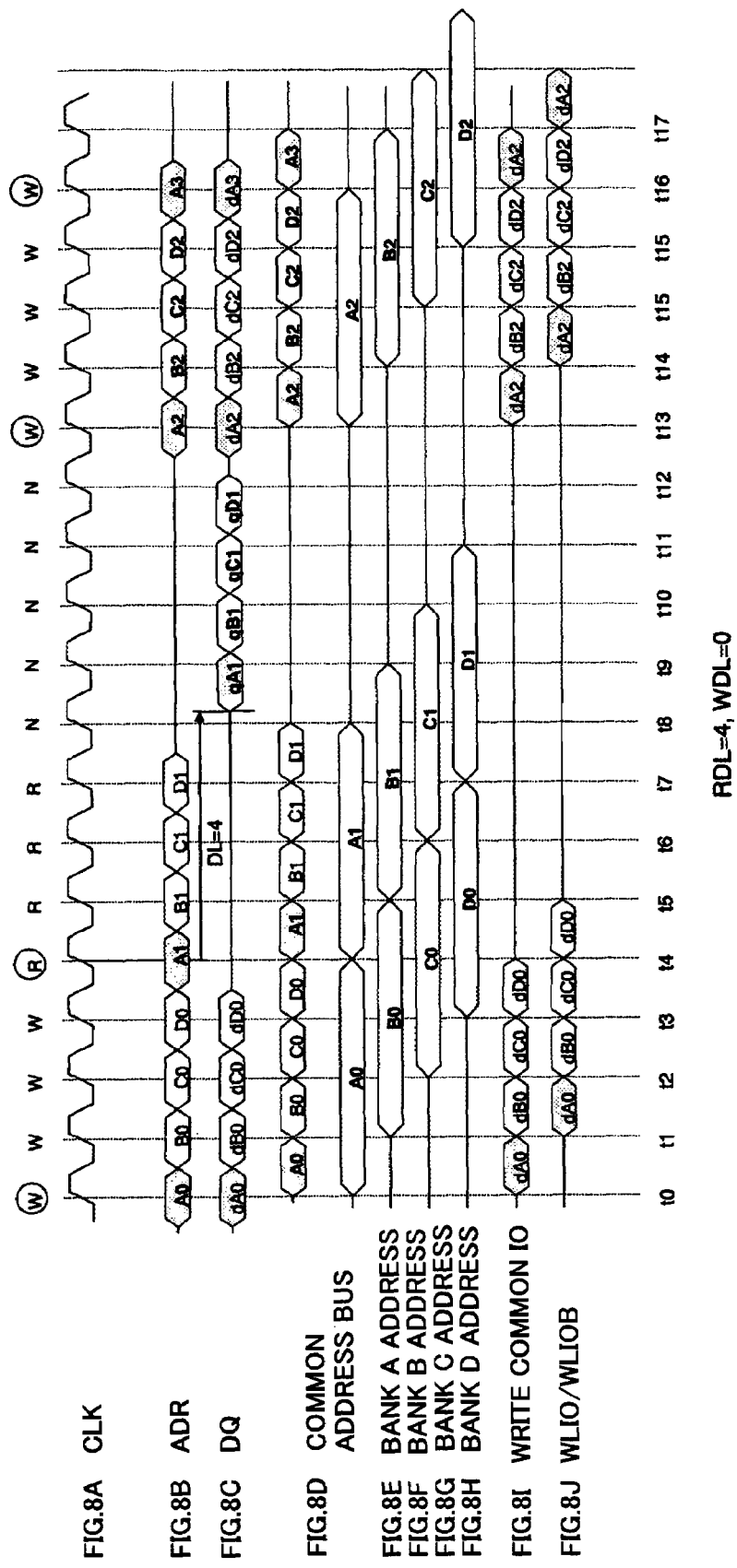

SEMICONDUCTOR MEMORY DEVICE

BACKGROUND OF THE INVENTION

1. Field of the Invention

The present invention relates to a DRAM having the multi-bank configuration and, particularly, a semiconductor memory device comprising a DRAM having a data register in a sense amplifier bank for performing late write.

2. Description of the Related Art

In a DRAM having a so-called multi-bank configuration including a plurality of memory banks, when continuously performing the operations of reading and writing, since write data latency and read data latency are different, it becomes necessary to insert an optional number of NOP instruction (standby instruction) to prevent data conflict of a data bus when shifting from reading to writing.

FIG. 7 is a block diagram of a configuration example of a multi-bank DRAM of the related art. As shown in FIG. 7, the multi-bank DRAM comprises an address latch circuit 100, a row decoder 110, a memory cell array 120, a column decoder 130, a column selector 140, a sense amplifier control circuit 150, a sense amplifier 160, a column address latency control circuit 170, a MA, LIO MUX control circuit 180, a bank address decoder 190, a multiface array timing generation circuit 200, a command decoder 210 and an input/output circuit 220.

Also, as shown in FIG. 7, the multi-bank DRAM of the present example is, for example, provided with four memory banks, that is, a bank A, a bank B, a bank C and bank D. In each memory bank, a row decoder 110, a memory cell array 120, a column decoder 130, a column selector 140, a sense amplifier control circuit 150 and a sense amplifier 160 are independently provided, respectively.

Below, each component of the multi-bank DRAM of the present example will be explained briefly.

The address latch circuit 100 holds an address ADR input from the outside and outputs the held address ADR to the row decoder 110, the column decoder 130, the column address latency control circuit 170 and the bank address decoder 190, respectively.

In each memory bank, in accordance with the input row address RADR, the row decoder 110 selects a word line specified by the row address RADR and activates the same.

The memory cell array 120 is configured by arranging a plurality of memory cells in a matrix. A word line is provided for each line of the matrix and a bit line is provided for each column. When accessing a memory cell array, the row decoder 110 selects a word line and the column selector 140 selects a bit line.

In accordance with the input column address CADR, the column decoder 130 generates a column selection signal and outputs it to the column selector 140.

The column selector 140 is provided with a plurality of column selection gates corresponding to the respective columns of the memory cell array. In accordance with a column selection signal output from the column decoder 130, a column selection gate corresponding to a column specified by the column address CADR is opened and a bit line of the selected column and a sense amplifier corresponding thereto are connected.

The sense amplifier control circuit 150 supplies a drive voltage to the sense amplifier 160 at a predetermined timing and controls an operation of the sense amplifier in accordance with control signals from the column address latency control circuit 170, the bank address decoder 190 and the multiface array timing generation circuit 200.

The sense amplifier 160 amplifies a potential difference of a bit line pair connected thereto and holds a voltage of an amplified bit line. When reading, the sense amplifier 160 amplifies the potential difference arisen in the bit line pair in accordance with memory data of a selected memory cell and outputs the amplification result to the outside so as to read out the stored data of the selected memory cell to the outside. On the other hand, when writing, the sense amplifier latches a voltage of the bit line pair in accordance with write data. In accordance with the latched bit line voltage, charges are stored in a capacitor of the selected memory cell.

The column address latency control circuit 170 generates a control signal to control a latency time of column accessing in accordance with an address ADR input from the address latch circuit 100 and outputs it to the sense amplifier control circuit 150 and the MA, LIO MUX control circuit 180.

The MA, LIO MUX control circuit 180 receives a column address and an MA control signal (WLIO write and read control signal) for selecting a set of WLIO from a plurality of WLIO for one main amplifier controlled by the column address latency control circuit 170 and performs a data transaction between the input/output circuit 220, the data register 290 and the sense amplifier 160.

The bank address decoder 190 generates a memory bank selection signal for selecting one memory bank from a plurality of memory banks in accordance with a bank address BADR input from the address latch circuit 100 and outputs it to the row decoder 110 and the column decoder 130 of the respective memory banks.

The multiface array timing generation circuit 200 generates a control signal for controlling operation timing at the time of memory accessing and outputs it to the row decoder 110 and the sense amplifier control circuit 150, respectively.

The command decoder 210 decodes a command CMD input from the outside, generates a read command RCMD and a write command WCMD in accordance therewith and outputs then to the bank address decoder 190.

The input/output circuit 220 holds write data DQ input from the outside and outputs the held write data to the MA, LIO MUX control circuit 180 via a data line WGIO when writing. While when reading, since data read from the selected memory cell by the sense amplifier 160 are output to the input/output circuit 220 via the MA, LIO MUX control circuit 180 and the data line WGIO, the input/output circuit 220 holds read data from the data line WGIO and outputs then to the outside.

FIG. 8A to FIG. 8J are timing charts when performing a writing, reading and writing operation on the same bank in a multi-bank DRAM of the related art. Below, the writing, reading and writing operations of the multi-bank DRAM of the related art will be explained with reference to FIG. 8A to FIG. 8J.

As shown in FIG. 8A to FIG. 8J, it is assumed that write data latency (latency time) is 0, read data latency is 4, an address input is low and no column multiplex. Furthermore, an array cycle time tRC is assumed to be a 4-clock cycle.

In the multi-bank DRAM in FIG. 8A to FIG. 8J, in memory accessing to the same bank, at least accessing to the same memory bank is controlled to be performed by waiting for the array cycle time tRC for preventing data destroy by an interruption of a series of refresh operation.

As shown in timing charts of FIG. 8A to FIG. 8J, a period of four cycles of a clock signal CLK from a time t0 is a write operation period (indicated by "W" in FIG. 8A to FIG. 8J), a 4-clock cycle from a time t4 is a read operation period in the same bank A (indicated by "R" in FIG. 8A to FIG. 8J), a 4-clock cycle from a time t8 is a NOP period (standby period) inserted for preventing conflict of data lines (indicated by "N" in FIG. 8A to FIG. 8J), and a 4-clock cycle from a time t13 is a next write operation period.

As shown in FIG. 8, write addresses A0, B0, C0 and D0 are input for every clock cycle in the write operation period (FIG. 8B). Also, write data dA0, dB0, dC0 and dD0 are successively input at the same time with the addresses (FIG. 8C).

In accordance with the input address, an address latched by the address latch circuit 100 is transferred to a common address bus shared by a plurality of memory banks (FIG. 8D).

As shown in FIG. 8E, a memory bank selected by the bank address, bank A here, is activated, and input write data dA0 is written to a selected memory cell in the bank A via the write common input/output circuit (WGIO) and a write data line WLIO/WLIOB.

Also in the same way, as shown in FIG. 8F to FIG. 8H, write data are successively transferred, such as the bank B at a time t1, the bank C at time t2 and the bank D at a time t3, and writing is performed on the memory cell specified by the respective banks by the write addresses.

In a read operation, similar to the write operation, a read address A1 is input to a common address bus at a time t4. Successively, read addresses B1, C1 and D1 are input to common address buses for each clock cycle.

At time t4, a read address A1 selected by a bank address is input, stored data are read from a memory cell specified by the address A1 in the bank A in accordance therewith, amplified by the sense amplifier, output from the bit line to read data lines RLIO and /RLIO, and furthermore output to the outside via the input/output circuit 220.

Continuously, from a time t5, the banks B, C and D are successively selected for each clock cycle, stored data are read from a memory cell selected by a read address input to each bank and successively output.

In the above multi-bank DRAM disclosed in Japanese Unexamined Patent Publication No. 3-273594, since the write latency is 0 and the read latency is 4, read data are not output until a point when the latency of four cycles of the clock signal CLK from the start of reading is past in a series of memory access operations of performing writing continuously from reading. Thus, when performing writing continuously from a reading operation, to prevent conflict of data on a common data bus, it is necessary to insert a standby time, that is, a NOP instruction corresponding to several cycles of the clock CLK.

By inserting the standby period between the read operation period and the write operation period, a state in which effective data do not exist on the common data bus appears at a certain frequency. Namely, the ratio of the time for transferring effective data on the data bus in the whole operation period is reduced, so that there arises a disadvantage that the utilization of the data bus declines or the effective data transfer rate of the data bus declines.

SUMMARY OF THE INVENTION

An object of the present invention is to provide a semiconductor memory device for improving the utilization of a common data bus and the data transfer rate in a multi-bank DRAM and realizing data accessing at a high speed without increasing the scale of a control circuit.

To attain the above object, according to the present invention, there is provided a semiconductor memory device having a plurality of memory banks sharing an address bus and a data bus, to which memory accessing is performed to a selected memory cell of a memory bank selected by an address, and each of said memory banks comprising an address register for holding a write address, a data register for holding write data, an address matching detection circuit for comparing an address held by said address register and an address input via said address bus and outputting an address matching signal when the two are matched, and a control circuit for outputting write data held in said data register as read data from a memory cell specified by said read address when receiving said address matching signal indicating that the write address held in said address register matches with the read address to be input by said matching detection circuit when performing reading continuously from writing.

Also, the present invention preferably comprises an address selection circuit for selecting either one of a write address held in said address register and an address input from said address bus by a write or read command and outputting the selected address to a row decoder and a column decoder.

Also preferably, the present invention furthermore comprises a data detection circuit for detecting whether data are held in said data register or not and a data transfer gate for outputting data held in said data register to a sense amplifier corresponding to a memory cell specified by said read address in accordance with a control signal from said control circuit when said data detection circuit detects that data are held in said data register.

Also preferably, the present invention comprises a write gate for transferring write data input from a write data line to said data register in accordance with a write control signal to said data register when writing.

Furthermore, in the present invention, twist bit lines are preferably used in a memory cell array in said memory bank.

According to the present invention, in a multi-bank semiconductor memory device having a plurality of memory banks, for example, in a multi-bank DRAM, in the case where an address register for holding a write address and a data register for holding write data are provided in each of the memory banks, and an address matching detection circuit for detecting whether an address held in an address register matches with an address to be input this time is also provided, when reading is performed continuously from writing on the same address of the same memory bank, since reading from a memory cell specified by a read address is not performed and held data of the data register are output as read data, continuous accessing becomes possible without inserting a NOP even in continuous read and write memory accessing.

BRIEF DESCRIPTION OF DRAWINGS

These and other objects and features of the present invention will become clearer from the following description of the preferred embodiments given with reference to the attached drawings, in which:

FIG. 8A to FIG. 8J are timing charts of an operation of the DRAM of the related art.

DESCRIPTION OF THE PREFERRED EMBODIMENT

Figure 1:
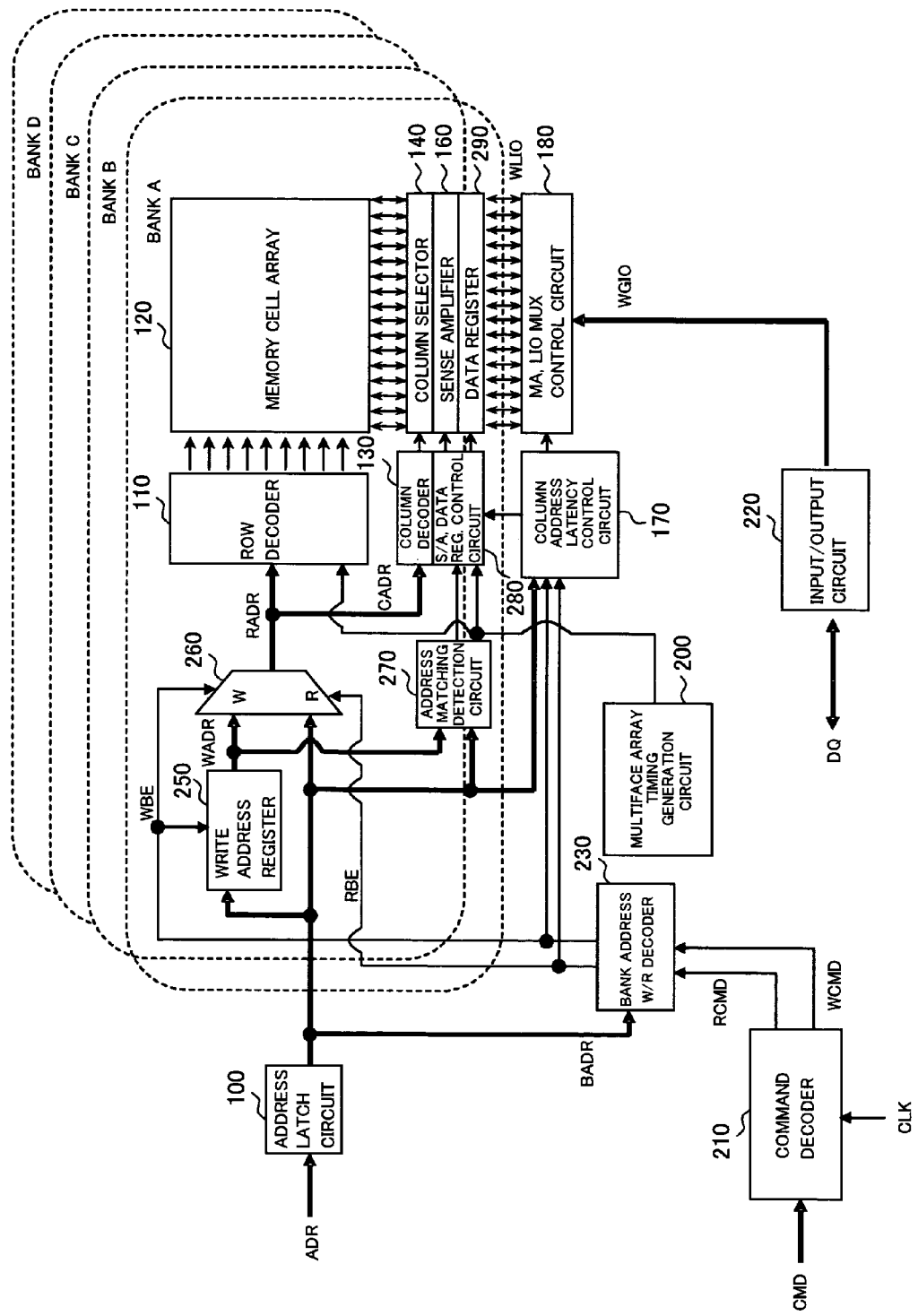
FIG. 1 is a view of the configuration of an embodiment of a semiconductor memory device according to the present invention.

FIG. 1 is a view of the configuration of an embodiment of a semiconductor memory device, that is, a DRAM according to the present invention.

As shown in FIG. 1, the DRAM of the present embodiment comprises a plurality of memory banks, that is, a so-called multi-bank DRAM. The plurality of memory banks share an address bus and a data bus (data line).

Each of the memory banks comprises, as shown in FIG. 1, a row decoder 110, a memory cell array 120, a column decoder 130, a column selector 140, a sense amplifier 160, a write address register 250, an address selection circuit 260, an address matching detection circuit 270, a sense amplifier and data register control circuit 280 and a data register 290.

Also, as a part shared by the memory banks, an address latch circuit 100, a column address latency control circuit 170, MA, LIO MUX control circuit 180, a multiface array timing generation circuit 200, a command decoder 210, an input/output circuit 220 and a bank address and write/read decoder 230 are provided.

Below, each component of the DRAM of the present embodiment will be explained.

The address latch circuit 100 holds an address ADR input from the outside and outputs the held address ADR to the address register 250, the address selection circuit 260, the address matching detection circuit 270, the column address latency control circuit 170 and the bank address and write/read decoder 230 of each of the memory banks, respectively.

In each memory bank, the write address register 250 holds a write address WADR input from the address latch circuit 100 and outputs to the address selection circuit 260 the held write address WADR together with the address ADR input from the address latch circuit 100.

The address selection circuit 260 is activated by an enable signal from the bank address and write/read decoder 230 shared by the memory banks, for example, as shown in FIG. 1, a write bank enable signal WBE or a read bank enable signal RBE. Then, either one of the write address WADR input from the write address register and the address ADR input from the address latch circuit 100 is selected during the operation, and a row address RADR included in the selected address is output to the row decoder 110 and a column address CADR is output to the column decoder 130.

The address matching detection circuit 270 detects whether the write address WADR input from the write address register 250 matches the address ADR input from the address latch circuit 100, generates a matching signal MTH when matched, and outputs the signal to the sense amplifier and data register control circuit 280.

The row decoder 110 selects a word line specified by the row address RADR in accordance with the row address input from the address selection circuit 260 and activates the same.

The memory cell array 120 is configured by arranging a plurality of memory cells in a matrix. A word line is provided to each line of the matrix, and a bit line is provided to each column. When access is made to the memory cell array, a word line is selected by the row decoder 110 and a bit line is selected by the column selector 140.

The memory cell comprises, for example, a transistor and a capacitor. One electrode of the transistor is connected to a bit line and the other electrode is connected to the capacitor. The capacitor stores charges in accordance with stored data of the memory cell. Also, since a gate of the transistor is connected to a word line, by activating a selected word line, transistors of memory cells connected to the selected word line become conductive at the time of memory accessing.

When reading, transistors of memory cells become conductive along with activation of the selected word line and charges are redistributed between the capacitor and the bit line; as a result, a bit line potential changes slightly in accordance with the stored data in the memory cells. Thus, a slight potential difference arises between a pair of bit lines connected to the sense amplifier. Since the potential difference between the bit lines is amplified by the sense amplifier, stored data in the selected memory cell are read to the outside in accordance with an amplification signal. Also, rewriting to the memory cell is performed in accordance with a bit line voltage amplified by the sense amplifier, and refresh of the memory cell is performed. While when writing, the sense amplifier latches the bit line voltage in accordance with write data. Then, charges are stored in a capacitor of the selected memory cell at the latched voltage. As a result, the write data are written to the selected memory cell.

The column decoder 130 generates a column selection signal in accordance with an input column address CADR and outputs it to the column selector 140.

The column selector 140 is provided with a plurality of column selection gates corresponding to the respective column of the memory cell arrays. In accordance with a column selection signal output from the column decoder 130, a column selection gate corresponding to a column specified by the column address CADR is opened, and a bit line of the selected column and a sense amplifier corresponding thereto are connected.

The sense amplifier 160 amplifies a potential difference between a pair of bit lines connected thereto and holds a voltage of the amplified bit line. For example, when reading, the sense amplifier 160 amplifies a potential difference that has arisen in a bit line pair in accordance with stored data of the selected memory cell and reads the stored data of the selected memory cell to the outside. On the other hand, when writing, the sense amplifier holds a bit line voltage in accordance with write data, and charges are stored in the capacitor of the selected memory cell in accordance with the held voltage, so that the write data are written in the selected memory cell.

The sense amplifier and data register control circuit 280 outputs a control signal for controlling the sense amplifier 160 and the data register 290 in accordance with an address matching detection signal MTH from the address matching detection circuit 270 and a control signal from the multiface array timing generation circuit 200.

Next, the part shared by the memory banks will be explained.

The address latch circuit 100 holds an address ADR input from the outside, as explained above.

The column address latency control circuit 170 generates a control signal for controlling a latency time of column accessing in accordance with an address ADR input from the address latch circuit 100 and outputs it to the sense amplifier and data register control circuit 280 and the MA, LIO MUX control circuit 180.

The MA, LIO MUX control circuit 180 receives a column address and MA control signal (WLIO write and read control signal) for selecting a set of WLIO from a plurality of WLIO for one main amplifier controlled by the column address latency control circuit 170 and performs data transaction with the input/output circuit 220, the data register 290 and the sense amplifier 160.

The multiface array timing generation circuit 200 generates a control signal for controlling an operation timing at the time of memory accessing and outputs it to the row decoder 110, the sense amplifier 160 and the sense amplifier and data register control circuit 280, respectively.

The command decoder 210 decodes a command CMD input from the outside, generates a read command RCMD and a write command WCMD in accordance therewith and outputs the commands to the bank address and write/read decoder 230.

The input/output circuit 220 holds write data DQ input from the outside and outputs the held write data to the MA, LIO MUX control circuit 180 via the data line WGIO when writing. Also, when reading, data read from a memory cell selected by the sense amplifier 160 are output to the input/output circuit 220 via the selected 180 and the data line WGIO, so that the input/output circuit 220 holds the data read from the data line WGIO and output to the outside.

The bank address and write/read decoder 230 generates an enable signal for selecting either one memory bank from a plurality of memory banks, for example, a write bank enable signal WBE or a read bank enable signal RBE, in accordance with a bank address BADR input from the address latch circuit 100 and outputs the signal to the memory banks and column address latency control circuit 170.

In the DRAM of the present embodiment having the above configuration, the write address register 250 and the data register 290, etc. are newly provided compared with the DRAM of the related art. At the time of memory cell accessing, the write address register 250 holds a write address WADR input from the address latch circuit 100. When writing is performed continuously on a memory cell having the same address, the write address held by the write address register 250 is selected by the address selection circuit 260, and the row address RADR and the column address CADR are supplied to the row decoder 110 and the column decoder 130, respectively. On the other hand, when the previous write data is held by the data register 290 and writing was performed continuously, the data held by the data register are written to the memory cell, so that an NOP is not necessary even when performing writing after reading.

Figure 2:
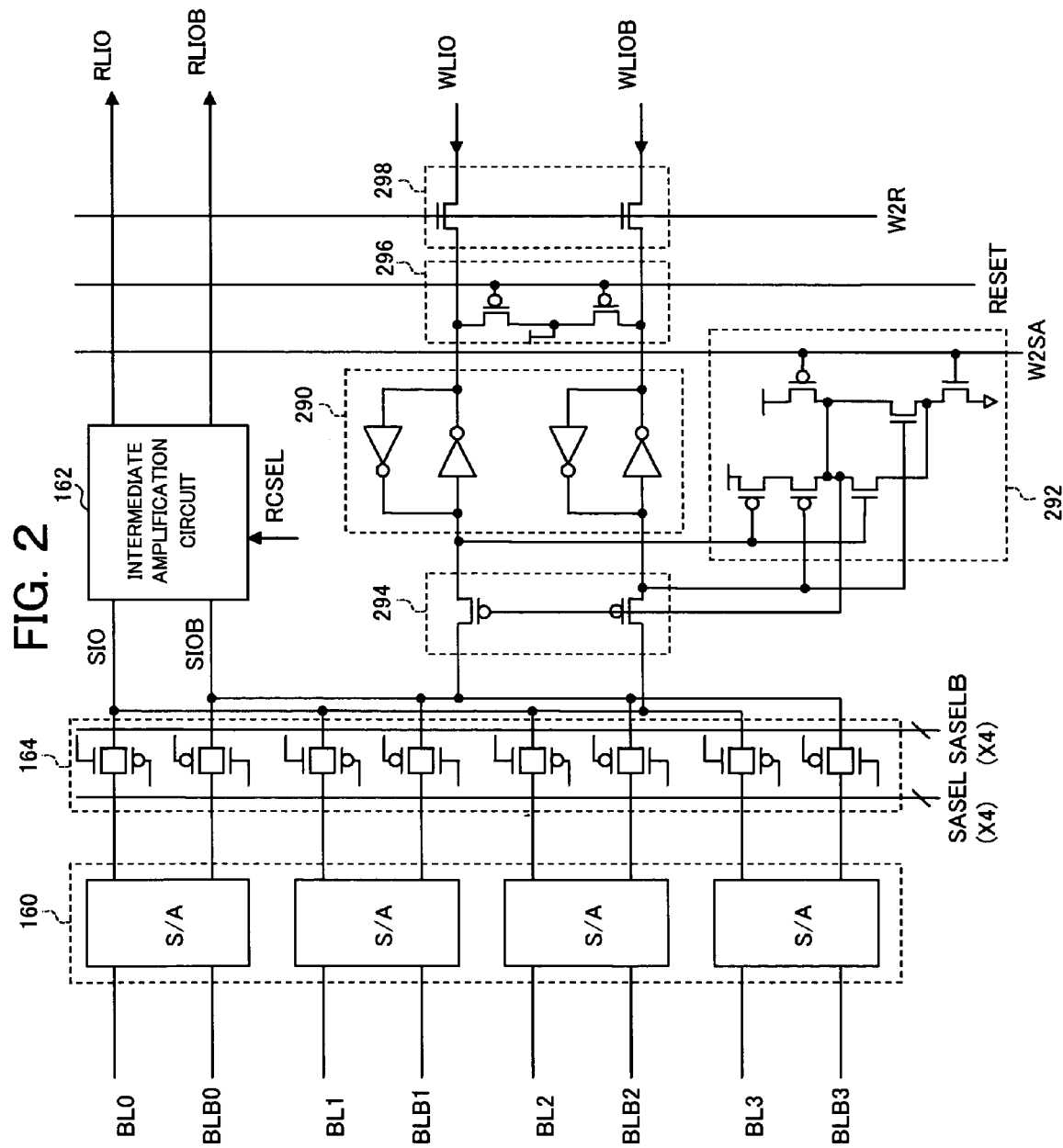
FIG. 2 is a circuit diagram of a configuration example of a sense amplifier bank.

FIG. 2 is a circuit diagram of a configuration example of a sense amplifier bank including the sense amplifier 160, the column selector 140 and the data register 290, etc.

As shown in FIG. 2, the sense amplifier bank includes a sense amplifier 160, an intermediate amplification circuit 162, a sense amplifier selector 164, a data register 290, a data detection circuit 292, a register transfer gate 294, a register equalizer 296 and a write gate 298.

The sense amplifier 160 is connected to bit lines made to be a pair, respectively. The sense amplifier 160 amplifies a potential difference of the bit line pair, respectively.

The sense amplifier selector 164 comprises selection gates (transfer gates) for selecting sense amplifiers. The respective selection gates are controlled by selection signals SASEL and SASELB output by the column selector. When reading and writing, a selection gate corresponding to a selected sense amplifier is opened, and a signal amplified by the selected sense amplifier is output to the intermediate amplification circuit 162.

The intermediate amplification circuit 162 operates at the time of reading, amplifies a read signal input from the selected sense amplifier and outputs the signal to the read data lines RLIO and RLIOB.

The data register 290 comprises a latch circuit as shown in FIG. 2, holds write data input via the write data line WLIO and WLIOB, and outputs the held write data to the sense amplifier selector 164 and the intermediate amplification circuit 162 via the register transfer gate 294.

The data detection circuit 292 detects whether data is held in the data register 290 and, when data is held, generates a data transfer enable signal DTE for activating the register transfer gate 294 and outputs to the register transfer gate 294.

In a standby state before writing, the input side of both latch circuits of the data register 290 is kept at a power source voltage $V_{DD}$ by the register equalizer 296. Namely, the output side of the latch circuits is kept at a low level. In response to this, the data detection circuit 292 outputs a data transfer enable signal DTE at a high level, so that the register transfer gate 294 is cut off. On the other hand, when write data are held in the data register 290, signals of different levels are output by both latch circuits of the data register 290 in accordance with the write data. Thus, in accordance with an output signal W2SA to the sense amplifier, an activated (low level) data transfer enable signal DTE is output by the data detection circuit 292 and the register transfer gate 294 becomes conductive in accordance therewith.

The register transfer gate 294 is provided between the data register 290 and the sense amplifier selector 164 or the intermediate amplification circuit 162 as shown in FIG. 2. When the register transfer gate 294 is in an activated state, write data held in the data register 290 are output to the sense amplifier selector 164 or the intermediate amplification circuit 162.

The register equalizer 296 precharges the input side of the data register 290 at a power source voltage $V_{DD}$ before writing. Therefore, the input side of the data register 290 is kept at a high level and the output side is kept at a low level at this time.

The write gate 298 is provided between the write data lines WLIO and WLIOB and the data register 290, and in accordance with a write signal W2R to the data register, the write gate 298 is activated and the write data are written in the data register 290.

In the sense amplifier bank having the above configuration, retrieving of the write data in the data register 290 is performed as described below. First, a reset signal RESET is activated (kept at a low level), the register equalizer 296 is activated in accordance therewith, and an input terminal of the data register 290 is precharged at a power source voltage $V_{DD}$. Then, the write signal W2R to the data register is activated (kept at a high level), so that the write gate 298 is opened and the input side of either one of two latch circuits composing the data register 290 is kept at a low level in accordance with the write data input from the write data lines WLIO and WLIOB, and consequently, the write data having inverted logic levels from each other are held in both of the latch circuits composing the data register 290.

As explained above, when writing, the write data input from the write data lines WLIO and WLIOB is held by the data register 290. Then, the held data of the data register 290 are output to the sense amplifier selector 164 via the register transfer gate 294 and output to a sense amplifier selected by the sense amplifier selection signals SASEL and SASELB. As a result, the selected sense amplifier holds the write data and the write data are written in the selected memory cell.

In normal reading, a potential difference of bit lines is amplified by the selected sense amplifier in accordance with the stored data of the selected memory cell, a signal read via the sense amplifier selector 164 is output to the intermediate amplification circuit 162, and the signal amplified by the intermediate amplification circuit 162 is output to the read data lines RLIO and RLIOB. However, in the DRAM of the present embodiment, when reading continued from writing is performed on the same memory cell of the same bank, the write data are held by the data register 290. Therefore, without reading data from the selected memory cell by the sense amplifier, the held data of the data register 290 are output to the sense amplifier corresponding to a selected bit line via the register transfer gate 294 and latched by the sense amplifier. Then, the data latched by the sense amplifier are output to the read data lines RLIO and RLIOB via the intermediate amplification circuit 162.

Note that, in the DRAM of the present embodiment, the sense amplifier bank is not limited to the configuration shown in FIG. 2 and may be configured differently.

Figure 3:
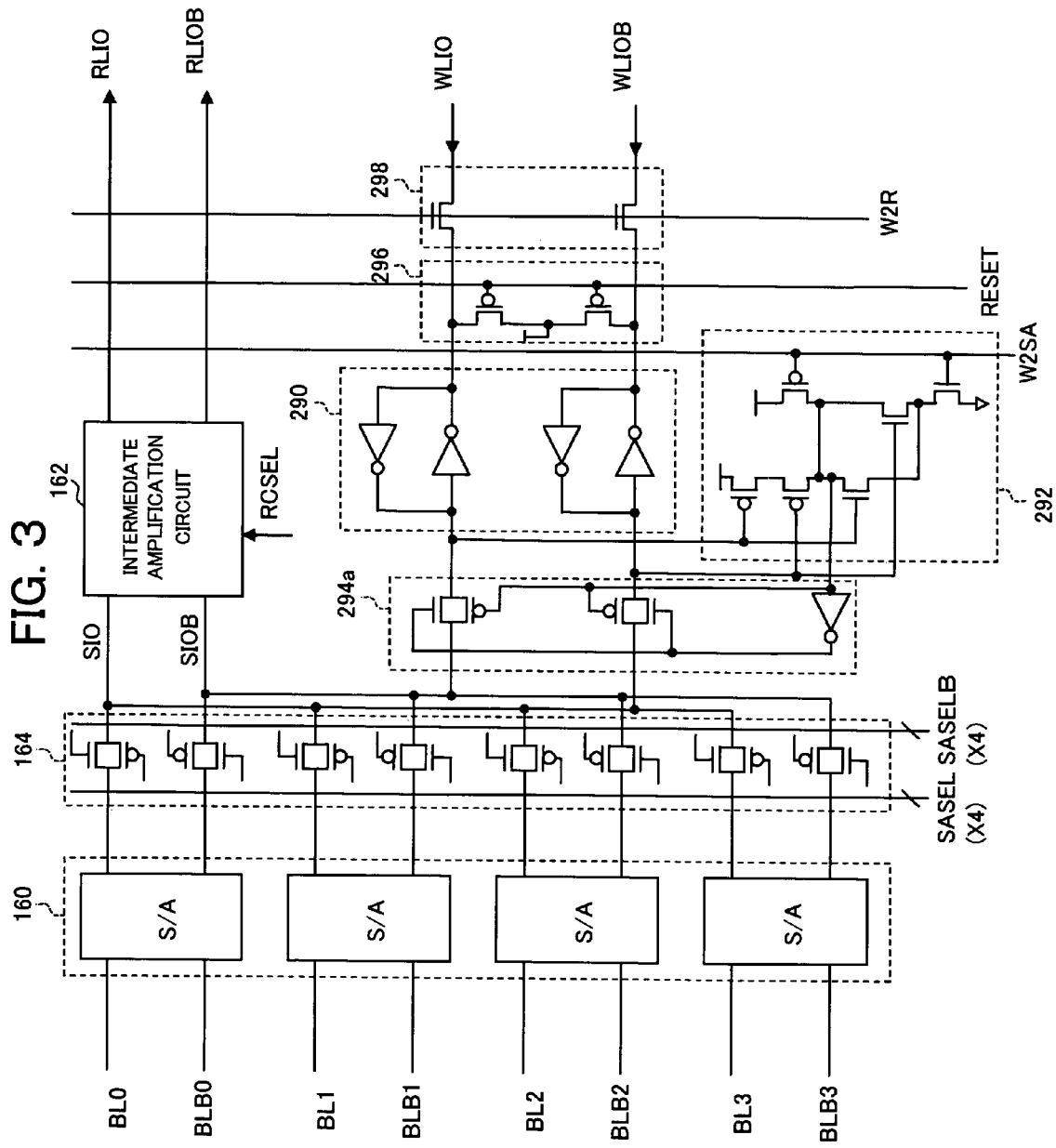
FIG. 3 is a circuit diagram of another configuration example of a sense amplifier bank.

FIG. 3 is a circuit diagram of another configuration example of a sense amplifier bank. As shown in FIG. 3, other than the register transfer gate 294a, the sense amplifier bank of the present example has the same configuration as the part corresponding to the sense amplifier bank shown in FIG. 2.

The register transfer gate 294a comprises transfer gates as shown in FIG. 3. A data detection signal output from the data detection circuit 292 is applied to a gate of a PMOS transistor composing the transfer gate, and a logic inversion signal thereof is applied to a gate of a nMOS transistor composing the transfer gate.

As a result, the sense amplifier bank shown in FIG. 3 operates in the same way as the sense amplifier bank shown in FIG. 2. Also, by using the transfer gate for the register transfer gate 294a, using twist bit lines, and changing a write timing to a memory cell, early write can be easily performed and a high speed array cycle time can be attained without affecting adjacent bit lines in refreshing by a bit line in writing.

Below, an operation at the time of memory cell accessing in the DRAM of the present embodiment will be explained with reference to the timing chart of memory cell accessing.

Figure 4:
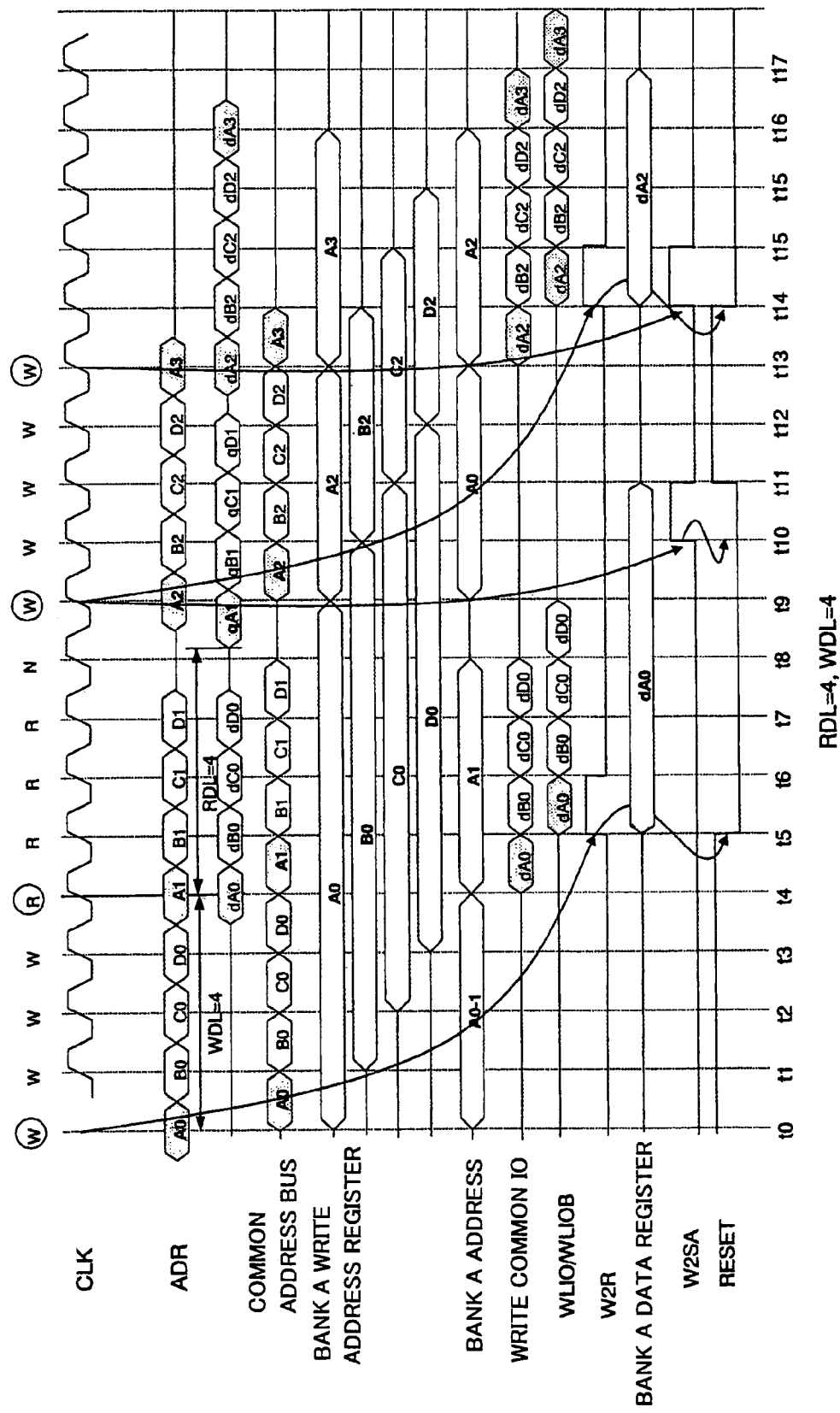
FIG. 4 is a timing chart of a write and read operation of a DRAM of the present embodiment.

FIG. 4 is a timing chart of a late write operation in the DRAM of the present embodiment. Below, the late write in the DRAM of the present embodiment will be explained with reference to FIG. 4. Note that, in the present embodiment, write latency and read latency are assumed to be 4. Namely, from an input of a write address to writing of data to a selected memory cell, there is a latency time of 4 cycles of a clock signal CLK, and when reading, there is also a latency time of 4 cycles of the clock signal CLK from an input of a read address to reading of stored data from a selected memory cell.

As shown in FIG. 4, first, at a time t0, a write command is input to a bank A and a write address A0 for the bank A is input. After a write latency is past, namely, at a time t4 when 4 cycles of the clock signal CLK has past, write data dA0 is input to the bank A.

A row address A0-1 corresponding to a word line selected in the bank A at a time t0 is a row address in the previous write accessing in the bank A. The row address A0 this time is held by the write address register 250 provided to the bank A until a write access is performed on the bank A next time.

In the same way, the write data dA0 to be input at a time t4 is held in the data register 290 provided to the bank A until a write access to the bank A arises next time.

In the same way as the above operation, a write address B0 for a bank B is input at a time t1, a write address C0 for a bank C is input at a time t2, and a write address D0 for a bank D is input at a time t3, so that writing is successively performed in each memory bank so as not to cause any conflicts with other memory banks. Also, write address and write data to be input are respectively held by the write address register and the data register provided to the respective memory banks. In the respective memory banks, the input write address and write data this time are held until the next write access to the respective memory banks.

Also, at the time t4, a read address A1 is input together with a read instruction to the memory bank A. After the read latency, that is, the 4 cycles of the clock signal CLK is past, for example, read data qA1 from the bank is read to the outside from a time t8 in FIG. 4.

Continuously, a read address B1 for the memory bank B is input at a time t5, a read address C1 for the memory bank C is input at a time t6, and a read address D1 for the memory bank D is input at a time t7. After a time t9, read data qB1 to qD1 are read out successively from the bank B to bank D.

As shown in FIG. 4, after the time t9, a write accessing of the next time is successively performed on the bank A to bank D.

As explained above, in the DRAM of the present embodiment, being different from the case without late write in the related art, since there are the same number of clocks of the write latency and read latency for performing the late write, in a series of writing, reading and writing operations, writing can be performed without inserting a NOP instruction for preventing conflict of data immediately before performing the next writing after reading only if a conflict between memory banks does not arise.

Note that, as shown in FIG. 4, the reason why the NOP is inserted once at the time t8 is to prevent a conflict of write data input from the outside and the final read data in the next write operation, because read data are output a little delayed from the clock signal CLK.

Note that, in the above write operation, the write address and write data are held respectively by the write address register 250 and the data register 290 provided for each memory bank. Also, in the sense amplifier and the data register control circuit 280, by counting the clock signal CLK from an input of a write command, when the write latency, that is, 4 cycles of the clock signal CLK is past, a control signal to instruct data retrieving is output to the data register 290. In response to this, write data to be input are retrieved and held in the data register 290.

Figure 5:
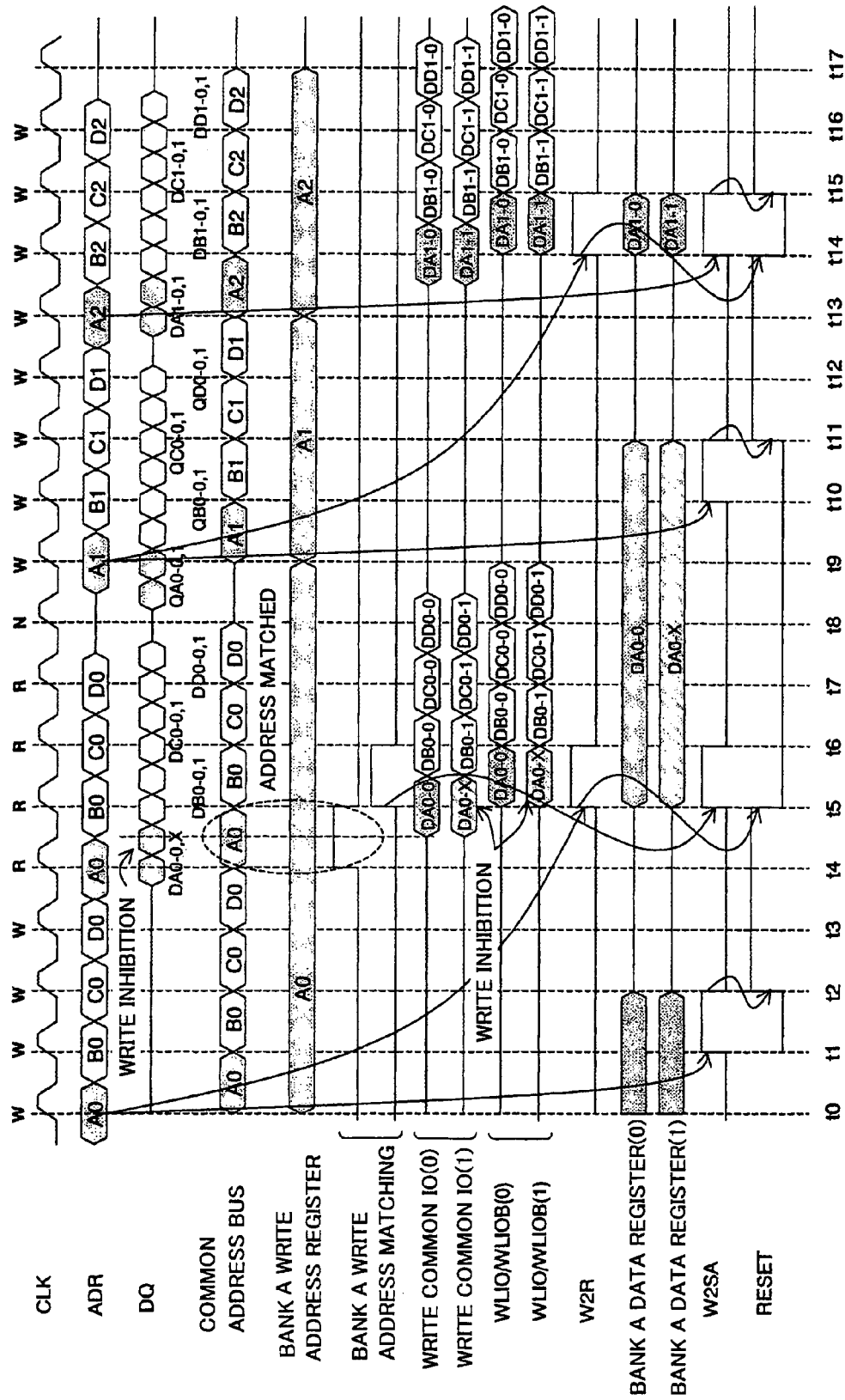
FIG. 5 is a timing chart of a series of write/read operations in the same word address in the same bank in the DRAM of the present embodiment.

FIG. 5 is a timing chart of a series of writing, reading and writing operations of a plurality of burst lengths; for example, two bits of burst length is performed on the same word address in the same bank in the DRAM of the present embodiment.

As shown in FIG. 5, first, at a time t0, a write command and a write address A0 are input to the bank A. At a time t4 when the write latency, that is, 4 cycles of clock signals CLK is past, the write data DA0-0 is input successively for 2 bits. Here, however, write inhibition is imposed on the write data of the second bit and only the data of the first bit is written in a desired memory cell. Also, the two-bit data is transferred at the same time for every clock (two-bit prefetch) and transferred to each data register provided for each bit.

As shown in FIG. 5, a write control signal W2R to the data register is activated at a time t5 in accordance with a write command and two-bit write data SA0-0 and DA0-X are retrieved by the data register in accordance therewith.

Continuously, at a time t4, it is assumed that a read command to a memory cell of the same bank as the write command input 4 cycles of clock signals CLK before is input. Namely, as shown in FIG. 5, the read address input at the time t4 is A0, which is the same as the write address input 4 cycles of clock signals CLK before. Of course, at the time t4, the write data DA0-0 retrieved in accordance with the write command is held in the data register 290 and not yet written in a specified memory cell. Also, the reading has two bits of burst length, and data has to be combined to be two bits of burst length by being put together with one bit of data written a while ago and data that existed in the memory cell first.

In this case, in the bank A, a write address (A0) held in the write address register 250 is compared with a read address (A0) input this time by the address matching detection circuit 270, and the two are matched, so that an address match detection signal MTH is output. In response to this, a write control signal W2SA to the sense amplifier is activated in the sense amplifier bank, and one bit of data held in the data register 290 in the sense amplifier bank is output to a bit line selected in accordance with the address A0 and latched by the sense amplifier connected to the bit line also in the read operation. Also, since the other one bit of data is imposed write inhibition when writing, there are no data in the data register, and the data detection circuit 292 shown in FIG. 2 detects that there are no data and data is read from the memory cell. The two bits of data are latched by the sense amplifier, amplified by the intermediate amplification circuit 162, and output to the read data lines RLIO and RLIOB. Therefore, the data in the data register, namely, the previous write data held in the data register are output as read data to the read data lines RLIO and RLIOB, as if data are read from the memory cell specified by the read address A0.

Also, in a bit wherein data are not written because of write inhibition 4 cycles of clocks CLK before, that is, DA0-X shown in FIG. 5, even when the data detection circuit 292 in the sense amplifier bank detects that data are not stored in the register and a write control signal W2SA to the sense amplifier is activated, since the register transfer gate 294 provided between the data register and the sense amplifier is kept closed, read data from the memory cell are transferred as it is to the read data lines RLIO and RLIOB via the intermediate amplification circuit 162.

Continuing to the write and read operations to the bank A, write and read operations are performed on the bank B, the bank C and the bank D in the same way. In each memory bank, it is judged by the address matching detection circuit whether a read address matches with a write address at the time of the last write accessing, and when matched, reading from the memory cell is not performed in the same way as in the reading operation in the bank A explained above and data held in the data register are transferred to the read data lines RLIO and RLIOB.

As explained above, in the DRAM of the present embodiment, the data register 290 and the data detection circuit 292, etc. other than the address matching detection circuit 270 are provided to the sense amplifier bank in each memory bank. In a series of memory accessing operations performing reading continuously from writing, the address matching detection circuit compares a read address with the write address in the previous write accessing, and when the addresses are matched, held data in the data register in the sense amplifier bank are output to the sense amplifier, latched by the sense amplifier and transferred to the read data line. Therefore, when writing and reading are continuously performed on the same word address in the same bank, data are not read from the memory cell in the reading continued from writing, and data held in the data register are directly output as the read data, so that a NOP is not necessary.

Also, in the present embodiment, since the data register is arranged in the sense amplifier bank, a complicated multiplexer, etc. required for data selection are not necessary and the circuit configuration can be simplified compared with the case of arranging a normal data register on other places. Also, in the present embodiment, a multiplexer for switching read data from a memory cell or held data from a data register is not necessary when configuring a DRAM having a late write function because the sense amplifier, the data register and the data detection circuit play an equivalent role to that of the multiplexer.

Also, when arranging the normal register to another place, the longer the burst length becomes, the more complicated the configuration of the multiplexer for switching data register data becomes. However, in the data register in the DRAM of the present embodiment, it can be dealt with the same circuit configuration regardless of the burst length.

Figure 6:
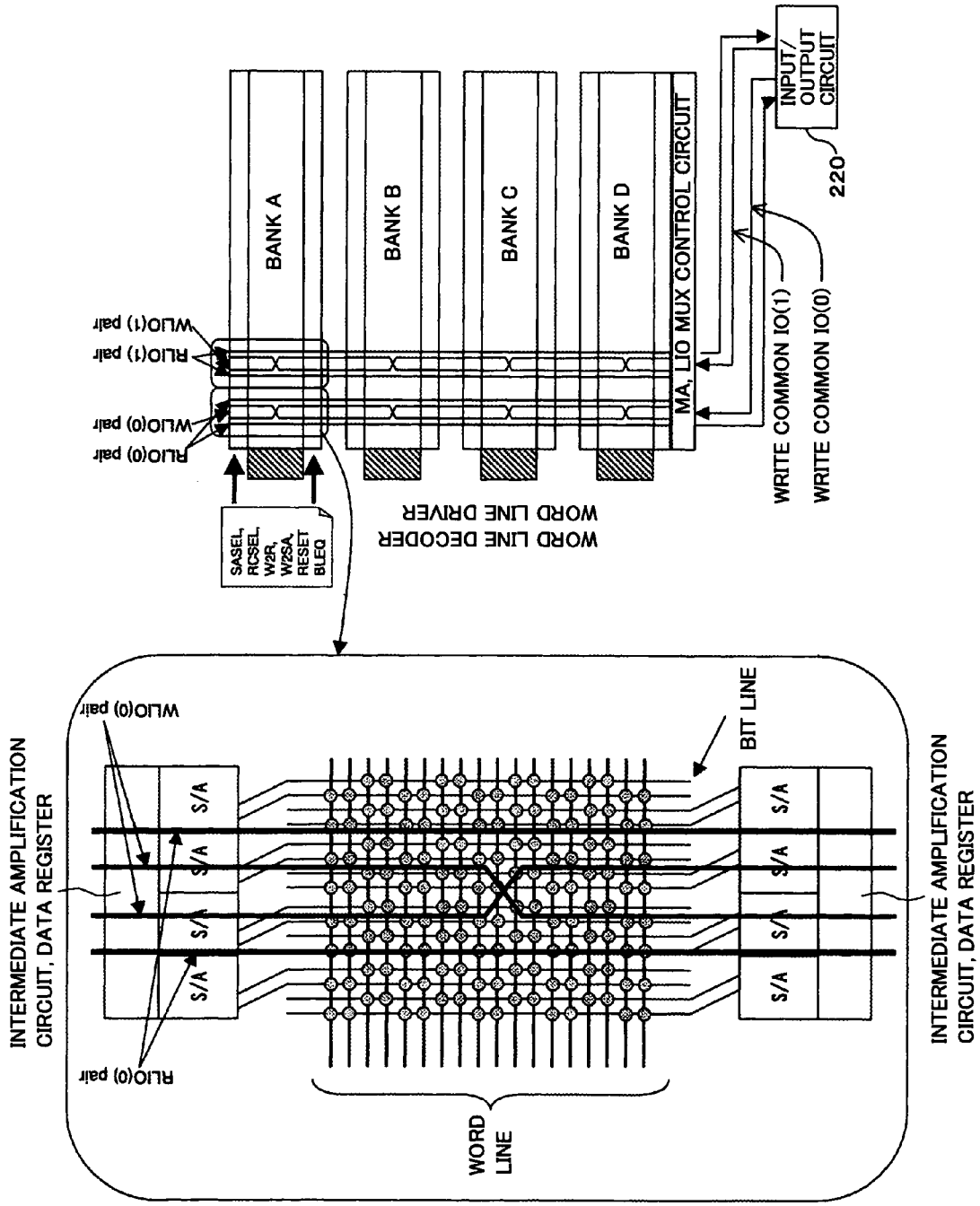
FIG. 6 is a view of the configuration of an example of using twist signal lines in each memory bank.
Figure 7:
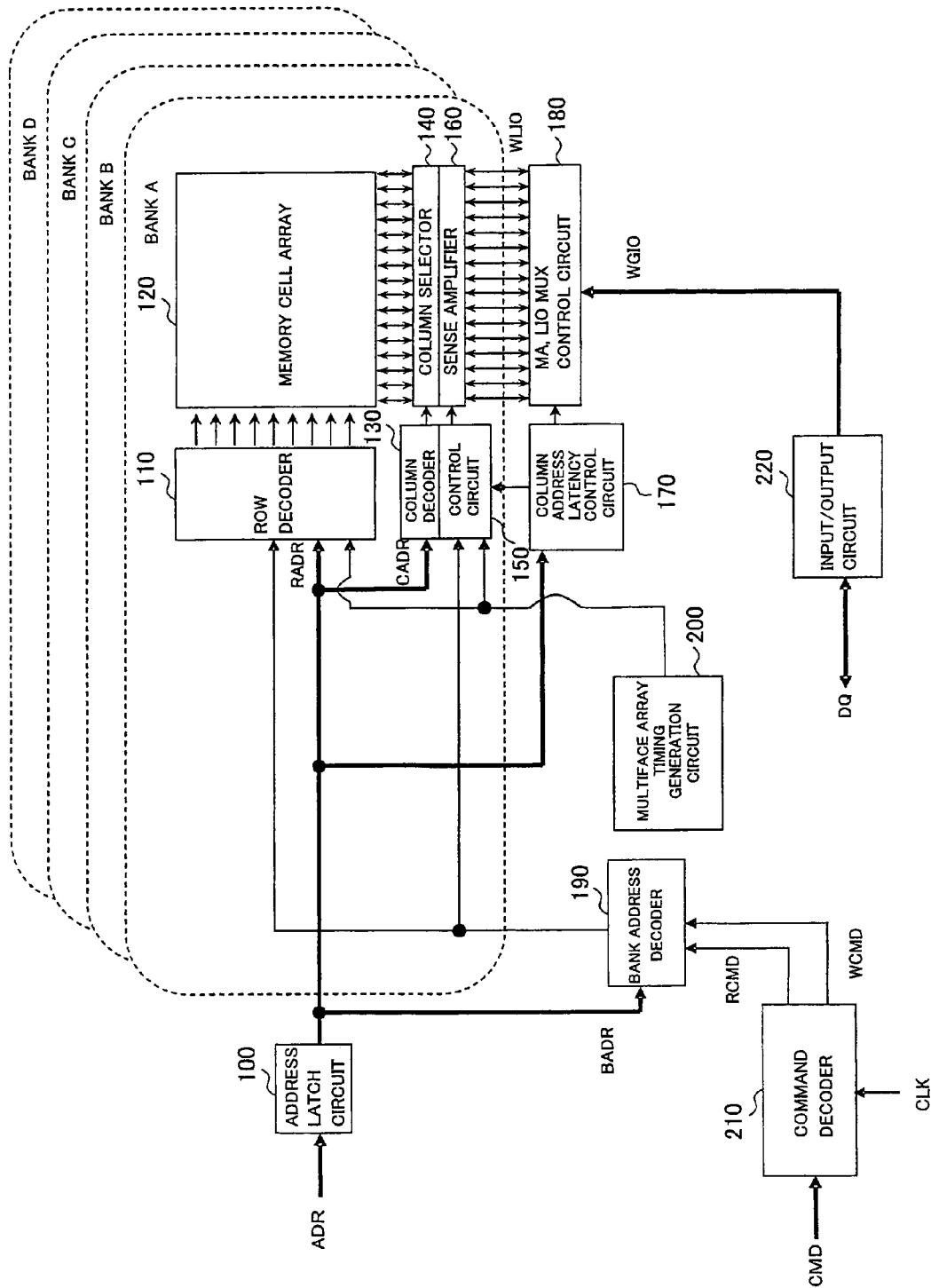
FIG. 7 is a view of the configuration of a configuration example of a DRAM of the related art.

Note that in the DRAM of the present embodiment, as shown in FIG. 6, by using twist bit lines in the memory cell array and sense amplifier bank of each memory bank, an affection due to capacitive coupling between bit lines can be cancelled to each other even when an adjacent bit line is in sensing, writing of write data to the memory cell can be performed earlier than activation of the sense amplifier and charges can be sufficiently stored in a capacitor in the memory cell. Therefore, the credibility of stored data in the memory cell is improved or an array cycle at the time of writing can be reduced, and a high speed writing operation can be attained.

As explained above, according to a semiconductor memory device of the present invention, there are the advantages that the data transfer rate can be improved and high speed write accessing can be realized while simplifying the circuit configuration in a multi-bank DRAM using a common address and data bus.

According to the present invention, in each memory bank, a data register is provided to a sense amplifier bank. When performing reading continuously from writing to the same word address of the same bank, reading from the memory cell is not performed and stored data in the data register are output as the read data, so that a complicated multiplexer is not necessary and reading can be performed by a simple control. Also, even when there is a plurality of data burst lengths and write inhibition is required in writing, a complicated data combining circuit is not necessary in the reading operation immediately after the writing, and data in the data register can be read as if they were in the memory cell, so that complicated control in the DRAM of the related art can be simplified.

Furthermore, according to the present invention, in the memory cell array of each memory bank, since write data can be prepared sufficiently early for writing before sensing by using twist bit lines and suppressing effects by capacity combination between adjacent bit lines, a write time can be shortened and high speed writing can be realized.

The embodiments explained above are for easier understanding of the present invention and not to limit the present invention. Accordingly, respective elements disclosed in the above embodiments include all modifications in designs and equivalents belonging to the technical field of the present invention.

What is claimed is:

1. A semiconductor memory device having a plurality of memory banks sharing an address bus and a data bus, to which memory accessing is performed to a selected memory cell of a memory bank selected by an address, each of said memory banks comprising:
an address register for holding a write address;
a data register for holding write data;
an address matching detection circuit for comparing an address held by said address register and an address input via said address bus and outputting an address matching signal when the two are matched; and
a control circuit for outputting write data held in said data register as read data from a memory cell specified by a read address when receiving said address matching signal indicating that said write address held in said address register matches with said read address to be input by said matching detection circuit when performing reading continuously from writing.

2. The semiconductor memory device as set forth in claim 1, comprising an address selection circuit for selecting either one of a write address held in said address register and an address input from said address bus and outputting the selected address to a row decoder and a column decoder.

3. The semiconductor memory device as set forth in claim 1, comprising a data detection circuit for detecting whether data is held in said data register or not.

4. The semiconductor memory device as set forth in claim 3, further comprising a data transfer gate for outputting data held in said data register to a sense amplifier corresponding to a memory cell specified by said read address in accordance with a control signal from said control circuit when said data detection circuit detects that data is held in said data register.

5. The semiconductor memory device as set forth in claim 1, comprising a write gate for transferring write data input from a write data line to said data register in accordance with a write control signal to said data register when writing.

6. The semiconductor memory device as set forth in claim 1, wherein twist bit lines are used in a memory cell array in said memory bank.

7. A semiconductor memory device having a plurality of memory banks sharing an address bus and a data bus, to which memory accessing is performed to a selected memory cell of a memory bank selected by an address, each of said memory banks comprising:
an address register for holding a write address;
a data register for holding write data;
an address matching detection circuit for comparing an address held by said address register and an address input via said address bus and outputting an address matching signal when the two are matched;
a control circuit for outputting write data held in said data register as read data from a memory cell specified by a read address when receiving said address matching signal indicating that said write address held in said address register matches with said read address to be input by said matching detection circuit when performing reading continuously from writing;
a data detection circuit for detecting whether data is held in said data register or not; and
a data transfer gate for outputting data held in said data register to a sense amplifier corresponding to a memory cell specified by said read address in accordance with a control signal from said control circuit when said data detection circuit detects that data is held in said data register.

8. The semiconductor memory device as set forth in claim 7, further comprising an address selection circuit for selecting either one of a write address held in said address register and an address input from said address bus and outputting the selected address to a row decoder and a column decoder.

9. The semiconductor memory device as set forth in claim 7, further comprising a write gate for transferring write data input from a write data line to said data register in accordance with a write control signal to said data register when writing.

10. The semiconductor memory device as set forth in claim 7, wherein twist bit lines are used in a memory cell array in said memory bank.

11. A semiconductor memory device having a plurality of memory banks sharing an address bus and a data bus, to which memory accessing is performed to a selected memory cell of a memory bank selected by an address, each of said memory banks comprising:
an address register for holding a write address;
a data register for holding write data;
an address matching detection circuit for comparing an address held by said address register and an address input via said address bus and outputting an address matching signal when the two are matched;
a control circuit for outputting write data held in said data register as read data from a memory cell specified by a read address when receiving said address matching signal indicating that said write address held in said address register matches with said read address to be input by said matching detection circuit when performing reading continuously from writing; and
a write gate for transferring write data input from a write data line to said data register in accordance with a write control signal to said data register when writing.

12. The semiconductor memory device as set forth in claim 11, further comprising an address selection circuit for selecting either one of a write address held in said address register and an address input from said address bus and outputting the selected address to a row decoder and a column decoder.

13. The semiconductor memory device as set forth in claim 11, comprising a data detection circuit for detecting whether data is held in said data register or not.

14. The semiconductor memory device as set forth in claim 13, further comprising a data transfer gate for outputting data held in said data register to a sense amplifier corresponding to a memory cell specified by said read address in accordance with a control signal from said control circuit when said data detection circuit detects that data is held in said data register.

15. The semiconductor memory device as set forth in claim 11, wherein twist bit lines are used in a memory cell array in said memory bank.

* * * * *